(12) United States Patent
Oomori et al.

(10) Patent No.: US 11,201,130 B2
(45) Date of Patent: Dec. 14, 2021

(54) SEMICONDUCTOR DEVICE (71) Applicant: SUMITOMO ELECTRIC INDUSTRIES, LTD., Osaka (JP)

(72) Inventors: Hirotaka Oomori, Osaka (JP); Takashi Tsuno, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 31 days.

(21) Appl. No.: 16/961,779

(22) PCT Filed: Dec. 3, 2018

(86) PCT No.: PCT/JP2018/044399
§ 371 (c)(1),
(2) Date: Jul. 13, 2020

(87) PCT Pub. No.: WO2019/146260
PCT Pub. Date: Aug. 1, 2019

(65) Prior Publication Data
US 2021/0066235 A1 Mar. 4, 2021

(30) Foreign Application Priority Data
Jan. 25, 2018 (JP) .............................. JP2018-010262

(51) Int. Cl.
*H01L 23/00* (2006.01)
(52) U.S. Cl.
CPC .............. *H01L 24/48* (2013.01); *H01L 24/05* (2013.01); *H01L 24/73* (2013.01)

(58) Field of Classification Search
CPC ......... H01L 24/48; H01L 24/05; H01L 24/73; H01L 23/3735
See application file for complete search history.

(56) References Cited

U.S. PATENT DOCUMENTS

| 9,502,343 B1* | 11/2016 | Hsieh | ..................... H01L 23/528 |
| 2006/0175700 A1* | 8/2006 | Kagii | ...................... H01L 24/40 257/706 |
| 2017/0213821 A1* | 7/2017 | Or-Bach | ........... H01L 21/76254 |

FOREIGN PATENT DOCUMENTS

| JP | 2009-188164 | 8/2009 |
| JP | 2016-195222 | 11/2016 |
| JP | 2016-195224 | 11/2016 |

* cited by examiner

*Primary Examiner* — Douglas W Owens
(74) *Attorney, Agent, or Firm* — IPUSA, PLLC (57) ABSTRACT

A semiconductor device includes a base plate; a metal plate above the base plate; a bonding material between the base plate and metal plate, bonding the metal plate to the base plate; an insulating plate on the metal plate; a circuit member on the insulating plate; a semiconductor element mounted on the circuit member; and a sealing material to seal a space on the base plate. The metal plate includes a bottom surface area along a periphery, exposed from the bonding material. The base plate includes a groove-shaped first recess formed along the periphery of the metal plate and faces the bottom surface area. The base plate also includes a groove-shaped second recess that is spaced apart from the first recess and that is formed on the inner side relative to the first recess. The bonding material is disposed in at least a part of the second recess.

13 Claims, 4 Drawing Sheets

SEMICONDUCTOR DEVICE

TECHNICAL FIELD

The disclosures herein relate to a semiconductor device.

The present application is based on and claims priority to Japanese patent application No. 2018-010262, filed on Jan. 25, 2018, with the Japanese Patent Office, the entire contents of which are hereby incorporated by reference.

BACKGROUND ART

A semiconductor device in which a stacked substrate is sealed by a hard resin is known. The stacked substrate includes a circuit board on which semiconductor chips are mounted (see Patent Document 1, for example).

RELATED-ART DOCUMENTS

Patent Documents

Patent Document 1: Japanese Laid-open Patent Publication No. 2016-195224

SUMMARY OF THE INVENTION

According to an embodiment of the present disclosure, a semiconductor device includes a base plate; a metal plate disposed above the base plate; a bonding material disposed between the base plate and the metal plate and in surface contact with the base plate and the metal plate so as to bond the metal plate to the base plate; an insulating plate disposed on the metal plate; a circuit member disposed on the insulating plate and in surface contact with the insulating plate; a semiconductor element mounted on the circuit member; and a sealing material that covers the metal plate, the bonding material, the insulating plate, the circuit member, and the semiconductor element to seal a space on the base plate. The metal plate includes a bottom surface area that is located along an outer periphery of the metal plate and that is not covered by the bonding material. The base plate includes a groove-shaped first recess that is formed along the outer periphery of the metal plate and that faces the bottom surface area. The base plate also includes a groove-shaped second recess that is spaced apart from the first recess and that is formed on the inner side relative to the first recess. The inner side is defined as a side closer to the center than the outer periphery of the metal plate. The bonding material is disposed in at least a part of the second recess.

MODE FOR CARRYING OUT THE INVENTION

Patent Document 1 discloses a semiconductor device including a metal plate, a base plate, and a sealing material. The surface of the base plate is bonded to the bottom surface of the metal plate, and a recess is formed on at least a part, facing the edge of the metal plate, of the surface of the base plate. The sealing material is formed of a hard resin, and contacts the semiconductor chips, an insulating plate, a circuit board, the side surfaces of the metal plate, and the bottom surface of the metal plate facing the recess. The recess, which is referred to as a groove, is filled with the sealing material, thus exhibiting an anchoring effect.

In Patent Document 1, in order to prevent solder that bonds the metal plate to the base plate, from flowing into the groove, the bottom surface and the side surfaces of the groove are not plated. In such a case, if there is an excess bonding material, the excess bonding material would wet and spread over the metal plate, or a lump of the excess bonding material would be formed at a boundary between the metal plate and the bonding material. As a result, interfacial peeling may occur between the sealing material and other components, or components of the stacked substrate may be cracked due to residual stress effects, thus resulting in reduced reliability of the semiconductor device.

In addition, in order to prevent an excess bonding material from flowing into the groove, it may be contemplated that the amount of the bonding material is adjusted to an appropriate amount. However, strictly controlling the amount of the bonding material may be difficult, and may prevent efficient manufacturing of the semiconductor device.

In view of the above, it is an object of the present disclosure to provide a semiconductor device that can be efficiently manufactured with high reliability.

Description of Embodiments of the Present Disclosure

First, embodiments of the present disclosure will be listed and described. A semiconductor device according to the present disclosure includes a base plate; a metal plate disposed above the base plate; a bonding material disposed between the base plate and the metal plate and in surface contact with the base plate and the metal plate so as to bond the metal plate to the base plate; an insulating plate disposed on the metal plate; a circuit member disposed on the insulating plate and in surface contact with the insulating plate; a semiconductor element mounted on the circuit member; and a sealing material that covers the metal plate, the bonding material, the insulating plate, the circuit member, and the semiconductor element to seal a space on the base plate. The metal plate includes a bottom surface area that is located along an outer periphery of the metal plate and that is not covered by the bonding material. The base plate includes a groove-shaped first recess that is formed along the outer periphery of the metal plate and that faces the bottom surface area. The base plate also includes a groove-shaped second recess that is spaced apart from the first recess and that is formed on the inner side relative to the first recess. The inner side is defined as a side closer to the center than the outer periphery of the metal plate. The bonding material is disposed in at least a part of the second recess.

In the above-described semiconductor device, the base plate is provided with the groove-shaped first recess that is formed along the outer periphery of the metal plate and that faces the bottom surface area. Therefore, it is possible to prevent components of the semiconductor device from cracking due to curing and shrinkage of the sealing material. That is, an anchoring effect can be obtained by forming the first recess.

Further, the base plate is provided with the groove-shaped second recess that is spaced apart from the first recess and that is formed on an inner side relative to the first recess. The inner side is defined as a side closer to the center than the outer periphery of the metal plate. Accordingly, even if there is an excess of the bonding material, the excess bonding material can flow into the second recess when the metal plate is bonded to the base plate. In this manner, the flow of the excess bonding material into the first recess can be reduced. In addition, it is also possible to reduce the possibility of the excess bonding material wetting and spreading over the exposed area, or a lump of the excess bonding material being formed between the metal plate and the bonding material. Further, the strict control of the amount of the bonding material becomes unnecessary. Furthermore, because the sealing material is in direct contact with the side surfaces of the first recess, an anchoring effect of the sealing material in the first recess can be sufficiently obtained. Accordingly, with the above-described configuration, it is possible to provide the semiconductor device that can be efficiently manufactured with high reliability.

In the above-described semiconductor device, the upper surface of the base plate and each side surface of the second recess may be connected at an obtuse angle. With this configuration, an excess bonding material can readily flow into the second recess. Further, it is also possible to reduce the generation of voids caused by air entrapped between the bonding material and the side surfaces of the second recess.

In the above-described semiconductor device, the width of the second recess may increase toward an upper end of the second recess. With this configuration, an excess bonding material can readily flow into the second recess.

In the above-described semiconductor device, the depth of the second recess may be less than or equal to the thickness of the bonding material. With this configuration, the metal plate can be securely bonded to the base plate by the bonding material.

In the above-described semiconductor device, the second recess may be located away from the semiconductor element in a plan view as viewed in the thickness direction of the base plate. With this configuration, heat generated by the semiconductor element can be sufficiently released to the base plate.

In the above-described semiconductor device, the second recess may be formed at a position closer to the outer periphery of the metal plate than the semiconductor element in the plan view as viewed in the thickness direction of the base plate. With this configuration, an excess bonding material can appropriately flow into the second recess.

In the above-described semiconductor device, the shortest distance between the semiconductor element and the second recess in the plan view as viewed in the thickness direction of the base plate may be larger than the distance between the upper surface of the circuit member and the upper surface of the base plate in the thickness direction of the base plate. With this configuration, heat generated by the semiconductor element can be sufficiently released to the base plate.

In the above-described semiconductor device, the second recess may be formed in a continuous loop shape in the plan view as viewed in the thickness direction of the base plate. With this configuration, an excess bonding material can efficiently flow into the second recess in the peripheral direction.

In the above-described semiconductor device, a plurality of second recesses may be arranged spaced apart from each other in a peripheral direction along the outer periphery of the metal plate. With this configuration, the plurality of second recesses can be formed at appropriate positions.

In the above-described semiconductor device, the first recess may be formed in a continuous loop shape in the plan view as viewed in the thickness direction of the base plate. With this configuration, it is possible to efficiently obtain an anchoring effect in the peripheral direction.

DETAILS OF EMBODIMENTS OF THE PRESENT DISCLOSURE

A semiconductor device according to an embodiment of the present disclosure will be described with reference to the accompanying drawings. In the following description, the same or corresponding elements are referred to by the same reference numerals, and a duplicate description thereof will not be repeated.

First Embodiment

Figure 1:
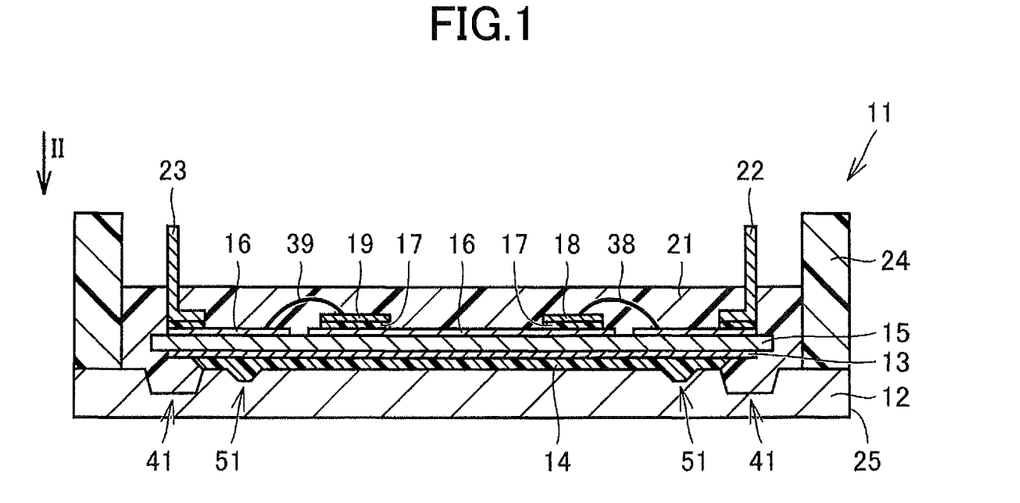
FIG. 1 is a schematic cross-sectional view of a semiconductor device according to an embodiment.
Figure 2:
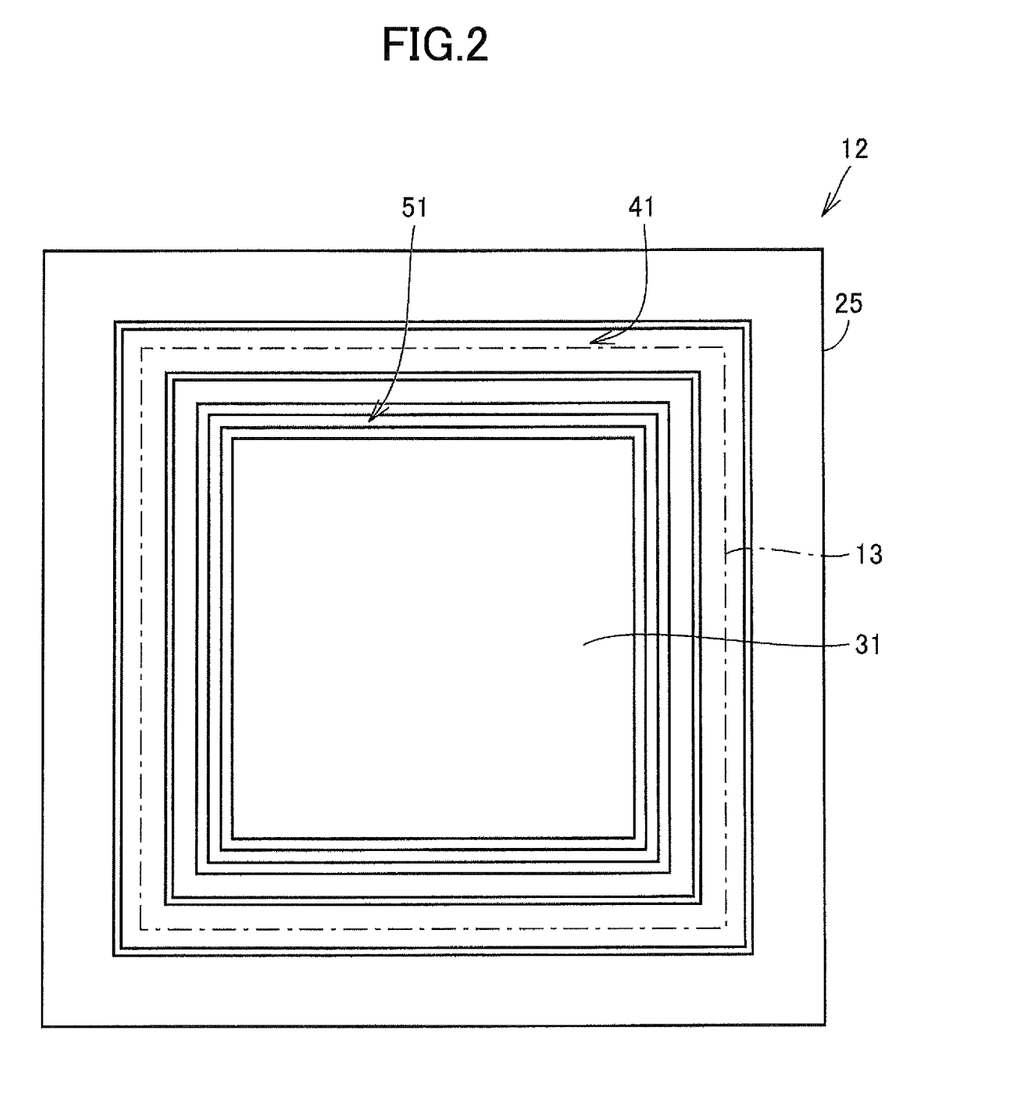
FIG. 2 is a plan view as viewed in the thickness direction of a base plate of the semiconductor device illustrated in FIG. 1.
Figure 3:
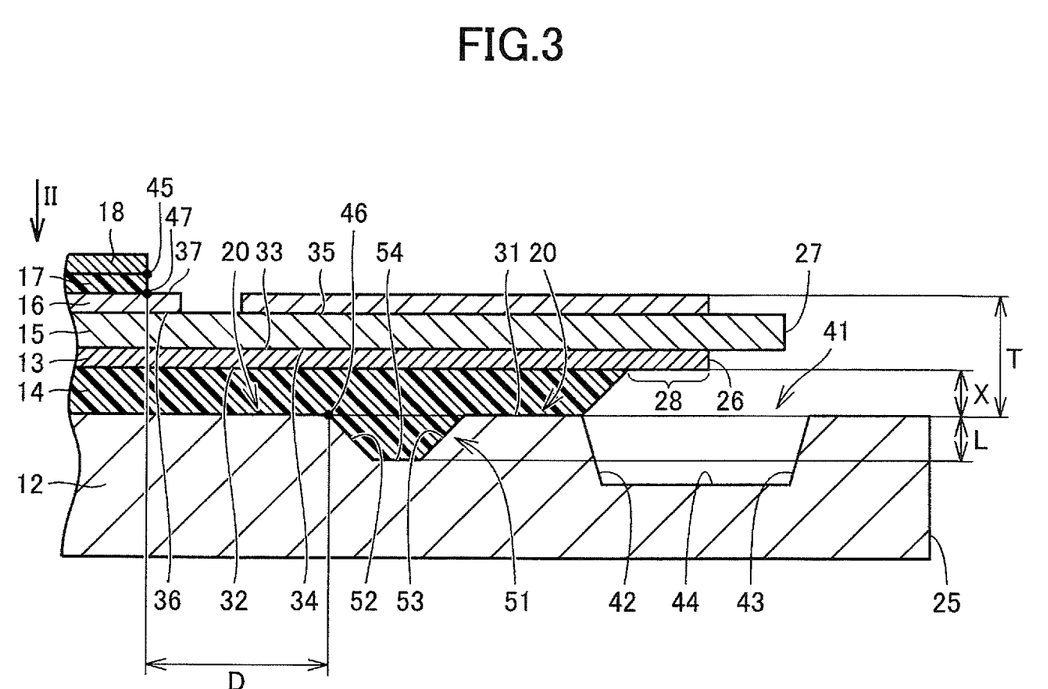
FIG. 3 is a partially enlarged cross-sectional view of the semiconductor device illustrated in FIG. 1.

FIG. 1 is a schematic cross-sectional view of the structure of a semiconductor device according to an embodiment. FIG. 2 is a plan view as viewed in the thickness direction of a base plate of the semiconductor device illustrated in FIG. 1. FIG. 3 is a partially enlarged cross-sectional view of the semiconductor device illustrated in FIG. 1. In FIG. 3, a sealing material depicted in FIG. 1 is not depicted. FIG. 1 and FIG. 3 are cross sections taken along the thickness direction of the base plate of the semiconductor device. FIG. 2 illustrates the base plate when viewed in the thickness direction of the base plate. The thickness direction is a direction indicated by an arrow II illustrated in FIG. 1. In order to facilitate understanding, the outer periphery of the metal plate is indicated by a dash-dot line in FIG. 2.

Referring to FIG. 1 through FIG. 3, a semiconductor device 11 according to an embodiment includes a base plate 12, a metal plate 13, bonding materials 14 and 17, an insulating plate 15, a circuit member 16, semiconductor elements 18 and 19, a sealing material 21, terminals 22 and 23, and an outer frame 24. The metal plate 13, the insulating plate 15, and the circuit member 16 are stacked in this order from the bottom.

The base plate 12, serving as a base of the semiconductor device 11, has a rectangular shape. The base plate 12 has a surface 31 on one side in the thickness direction of the base plate 12. Components such as the metal plate 13, the insulating plate 15, and the circuit member 16 are disposed on the surface 31. Examples of the material of the base plate 12 include a material having high thermal conductivity, specifically a metal material such as copper or aluminum, and a composite material of metal and ceramic. In the semiconductor device 11 illustrated in FIG. 1, the metal plate 13 is disposed above the surface 31. However, when the semiconductor device 11 is arranged upside down, the components of the semiconductor device 11 are arranged in reverse order. That is, when the semiconductor device 11 is arranged upside down, "the metal plate 13 is disposed above the surface 31" means that "the metal plate 13 is disposed below the surface 31". When the semiconductor device 11 is arranged laterally or in an inclined manner, the components of the semiconductor device 11 are also arranged laterally or in an inclined manner. The structure of the base plate 12 will be described in detail below.

The metal plate 13 is disposed above the surface 31. The metal plate 13 also has a rectangular shape. An outer periphery 26 of the metal plate 13 is located inward relative to an outer periphery 25 of the base plate 12 in a plan view as viewed in the thickness direction of the base plate 12. The metal plate 13 has a surface 32 facing the surface 31 of the base plate 12, and has a surface 33 located on the side opposite to the surface 32 in the thickness direction of the base plate 12. Further, the surface 32 includes an area 28 that includes the outer periphery 26 and is exposed from the bonding material 14. The area 28 exposed from the bonding material 14 means that the area 28 is not covered by the bonding material 14. In other words, the area 28 not covered by the bonding material 14 is a bottom surface area located along the outer periphery 26 of the metal plate 13. The metal plate 13 is formed of, for example, a thin metal material that is electrically conductive. Specifically, copper foil is used as the metal plate 13. The metal plate 13 is bonded to the base plate 12 by the bonding material 14.

The bonding material 14 is provided between and in contact with both the surface 31 and the surface 32. That is, the bonding material 14 is interposed between the base plate 12 and the metal plate 13. For example, solder may be employed as the bonding material 14. In addition, an area of the surface 31 in contact with the bonding material 14 may be plated so as to increase the wettability with the bonding material 14.

The insulating plate 15 is disposed on and in contact with the surface 33. The insulating plate 15 also has a rectangular shape. An outer periphery 27 of the insulating plate 15 is located inward relative to the outer periphery 25 of the base plate 12, and also located outward relative to the outer periphery 26 of the metal plate 13 in the plan view as viewed in the thickness direction of the base plate 12. The insulating plate 15 has a surface 34 facing the surface 33 of the metal plate 13, and has a surface 35 located on the side opposite to the surface 34 in the thickness direction of the base plate 12. For example, the insulating plate 15 is formed of a ceramic material having insulation properties. Specific examples of the material of the insulating plate 15 include aluminum oxide, aluminum nitride, and silicon nitride. Note that the thickness direction of the base plate 12 is the same as the thickness direction of the insulating plate 15.

The circuit member 16 is disposed on and in contact with the surface 35. A circuit pattern is formed on the circuit member 16. The circuit member 16 has a surface 36 facing the surface 35 of the insulating plate 15, and has a surface 37 located on the side opposite to the surface 36 in the thickness direction of the base plate 12. Similar to the metal plate 13, the circuit member 16 is formed of a thin metal material that is electrically conductive, for example.

The semiconductor elements 18 and 19 are mounted on the surface 37 via the bonding material 17. That is, the semiconductor elements 18 and 19 are bonded and fixed to the surface 37 by the bonding material 17. The semiconductor elements 18 and 19 are electrically connected to respective areas of the circuit member 16 via bonding wires 38 and 39. The respective areas of the circuit member 16 are separated from the area where the semiconductor elements 18 and 19 are mounted. In the present embodiment, the two semiconductor elements 18 and 19 are mounted; however, the number and arrangement of semiconductor elements may be appropriately determined in accordance with the configuration of the semiconductor device 11.

The terminals 22 and 23 are electrically connected and fixed to the respective areas of the circuit member 16 where the semiconductor elements 18 and 19 are not mounted. Each of the terminals 22 and 23 are formed by bending a member made of metal. One end of each of the terminals 22 and 23, which is not connected to the circuit member 16, is not covered by the sealing material 21 and is exposed.

The sealing material 21 covers the metal plate 13, the bonding materials 14 and 17, the insulating plate 15, the circuit member 16, and the semiconductor elements 18 and 19 to seal a space above the surface 31. For example, a resin having high insulation properties and heat resistance is used as the sealing material 21. Specifically, a thermosetting resin such as an epoxy resin or a phenolic resin is used. For example, a filler may be added to the sealing material 21 to improve insulation properties, as necessary.

The outer frame 24 is attached to the surface 31 along the outer periphery 25 of the base plate 12. The space above the surface 31 can be covered by the outer frame 24, expect for the upper side in the thickness direction of the base plate 12. The sealing material 21 is formed by pouring an uncured epoxy resin or the like into the space surrounded by the outer frame 24, and curing the epoxy resin.

Next, the shape of the base plate 12 is described in detail. A groove-shaped first recess 41 is formed on the surface 31 of the base plate 12 along the outer periphery 26 of the metal plate 13. The first recess 41 is disposed facing the area 28 not covered by the bonding material 14 in the plan view as viewed in the thickness direction of the base plate 12. The first recess 41 is formed in a continuous loop shape. Further, the depth of the first recess 41 is, for example, less than or equal to half the thickness of the base plate 12. Note that the base plate 12 may have any width that allows the liquid sealing material 21 to sufficiently flow into the base plate 12.

The first recess 41 is defined by a pair of side surfaces 42 and 43 and a bottom surface 44. The side surfaces 42 and 43, which are side wall surfaces defining the first recess 41, and the surface 31 are connected at obtuse angles. That is, the upper surface (surface 31) of the base plate 12 and the side surfaces 42 and 43 of the first recess 41 are connected at obtuse angles. The bottom surface 44 extends in a direction along the surface 31. As illustrated in the cross section of FIG. 3, the first recess 41 has a shape whose width increases toward the upper end (opening) of the first recess 41. The sealing material 21 is disposed in the first recess 41.

In addition, a groove-shaped second recess 51 is formed on the surface 31. The second recess 51 is spaced away from the first recess 41. Assuming that the inner side is defined as a side closer to the center than the outer periphery 26 of the metal plate 13, the second recess 51 is provided on the inner side relative to the first recess 41. The second recess 51 is formed in a continuous loop shape in the plan view as viewed in the thickness direction of the base plate 12. The second recess 51 may extend in parallel to the first recess 41.

The second recess 51 is defined by a pair of side surfaces 52 and 53 and a bottom surface 54. The side surfaces 52 and 53, which are side wall surfaces defining the second recess 51, and the surface 31 are connected at obtuse angles. That is, the upper surface (surface 31) of the base plate 12 and the side surfaces 52 and 53 of the second recess 51 may be connected at obtuse angles. The bottom surface 54 extends in a direction along the surface 31. As illustrated in the cross section of FIG. 3, the second recess 51 has a shape whose width increases toward the upper end (opening) of the second recess 51. The bonding material 14 is disposed in at least a part of the second recess 51. In the example illustrated in FIG. 3, the bonding material 14 is disposed in the entire second recess 51.

The depth of the second recess 51 is, for example, less than or equal to the thickness of the bonding material 14. Specifically, the thickness X of the bonding material 14 illustrated in FIG. 3 is 0.1 mm. The length L from the surface 31 to the bottom surface 54, which corresponds to the depth, in the thickness direction of the base plate 12, of the second recess 51, is less than or equal to the thickness X.

Further, the second recess 51 is located away from the semiconductor elements 18 and 19 in the plan view as viewed in the thickness direction of the base plate 12. The second recess 51 is formed at a position closer to the outer periphery of the base plate 12 than the semiconductor elements 18 and 19 in the plan view as viewed in the thickness direction of the base plate 12. Further, in the cross section of FIG. 3, the distance D, in a direction perpendicular to the thickness direction of the base plate 12, between a portion 47 of the circuit member 16, which corresponds to the end 45 of the semiconductor element 18, and an end 46 of the side surface 52 of the second recess 51 is larger than the total thickness T of the bonding material 14, the metal plate 13, the insulating plate 15, and the circuit member 16. The end 45 of the semiconductor element 18 is an end closer to the outer periphery of the base plate 12. The end 46 of the side surface 52 is an end farther from the outer periphery of the base plate 12. That is, the shortest distance D between the semiconductor element 18 and the second recess 51 in the plan view as viewed in the thickness direction of the base plate 12 may be larger than the distance T between the upper surface of the circuit member 16 and the upper surface of the base plate 12 in the thickness direction of the base plate 12.

Next, a method for manufacturing the semiconductor device 11 having the above-described configuration will be described. In the above-described semiconductor device 11, first, the metal plate 13, the insulating plate 15, and the circuit member 16 are stacked to form a laminate. Then, the surface 32 is bonded to the surface 31 by the bonding material 14. Subsequently, the uncured liquid sealing material 21 is poured and cured for sealing.

In order to bond the surface 32 to the surface 31, the bonding material 14 formed of paste solder is used. The paste solder forming the bonding material 14 is placed on the surface 31, and the metal plate 13, on which the insulating plate 15 is stacked, is placed on the bonding material 14. The solder melts when heated, and wets and spreads over the surface 31. An excess of the spread solder flows into the second recess 51. That is, the possibility of an excess bonding material 14 flowing into the first recess 41 or wetting and spreading over the surface 32 can be reduced. In this manner, the semiconductor device 11 is manufactured.

In the semiconductor device 11 having the above-described configuration, the groove-shaped first recess 41 is disposed facing the area 28 that is not covered by the bonding material 14 in the plan view as viewed in the thickness direction of the base plate 12. Therefore, it is possible to prevent components of the semiconductor device 11 from cracking due to curing and shrinkage of the sealing material 21. That is, an anchoring effect can be obtained by providing the first recess 41.

Further, the surface 31 is provided with the groove-shaped second recess 51 that is spaced apart from the first recess 41 and is formed inward relative to the first recess 41. Therefore, even if there is an excess bonding material 14, the excess bonding material 14 can flow into the second recess 51 when the metal plate 13 is bonded to the base plate 12. In this manner, it is possible to reduce the flow of the excess bonding material 14 into the first recess 41. In addition, it is also possible to reduce the possibility of the excessive bonding material 14 wetting and spreading over the area 28, or a lump of the excess bonding material being formed between the metal plate 13 and the bonding material 14. Further, the strict control of the amount of the bonding material 14 becomes unnecessary. In addition, by causing the sealing material 21 to be in direct contact with the side surfaces 42 and 43 and the bottom surface 44 of the first recess 41, it is possible to provide a sufficient anchoring effect of the sealing material 21 in the first recess 41. Accordingly, it is possible to provide the semiconductor device 11 that can be efficiently manufactured with high reliability.

In the present embodiment, the surface 31 and the side surfaces 52 and 53 of the second recess 51 are connected at obtuse angles. Accordingly, an excess bonding material 14 can readily flow into the second recess 51. Further, it is also possible to reduce the generation of voids caused by air entrapped between the bonding material 14 and the side surfaces 52 and 53.

In the present embodiment, in the cross section illustrated in FIG. 3, the width of the second recess 51 increases toward the upper end (opening) of the second recess 51. Accordingly, an excess bonding material 14 can readily flow into the second recess 51.

In the present embodiment, the depth of the second recess 51 is less than or equal to the thickness of the bonding material 14. Accordingly, the base plate 12 and the metal plate 13 can be securely bonded by the bonding material 14.

In the present embodiment, the second recess 51 is located away from the semiconductor element 18 in the plan view as viewed in the thickness direction of the base plate 12. Accordingly, heat generated by the semiconductor element 18 can be sufficiently released to the base plate 12.

In the present embodiment, the second recess 51 is formed on the side closer to the outer periphery 25 than the semiconductor element 18 in the plan view as viewed in the thickness direction of the base plate 12. In addition, the second recess 51 is formed on the side closer to the outer periphery 26 of the metal plate 13 than the semiconductor element 18 in the plan view. Accordingly, an excess bonding material 14 can appropriately flow into the second recess 51.

In the present embodiment, in the cross section illustrated in FIG. 3, the distance D between the portion 47 of the circuit member 16, which corresponds to the end 45 of the semiconductor element 18, and the end 46 of the side surface 52 of the second recess 51 in the direction perpendicular to the thickness direction of the base plate 12 is larger than the total thickness T of the bonding material 14, the metal plate 13, the insulating plate 15, and the circuit member 16. The end 45 of the semiconductor element 18 is an end closer to the outer end of the base plate 12, and the end 46 of the side surface 52 is an end farther from the outer end of the base plate 12. Accordingly, heat generated by the semiconductor element 18 can be sufficiently released to the base plate 12.

In the present embodiment, the second recess 51 is formed in a continuous loop shape in the plan view as viewed in the thickness direction of the base plate 12. Accordingly, an excess bonding material 14 can accurately flow into the second recess 51 in the peripheral direction.

In the present embodiment, the first recess 41 is formed in a continuous loop shape in the plan view as viewed in the thickness direction of the base plate 12. Accordingly, an anchoring effect can be more efficiently obtained in the peripheral direction.

Second Embodiment

Figure 4:
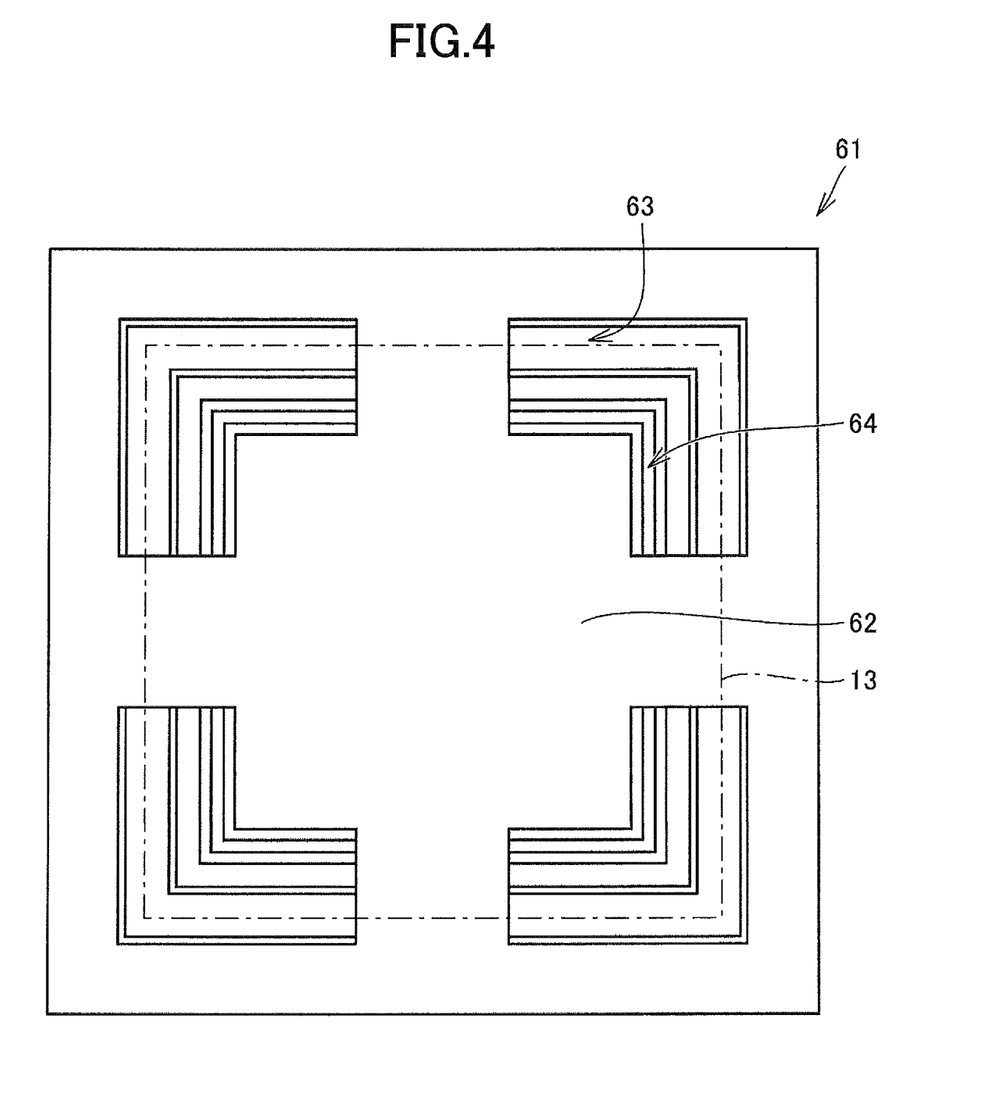
FIG. 4 is a plan view as viewed in the thickness direction of a base plate of a semiconductor device according to another embodiment.

In the first embodiment, the second recess 51 is formed in a continuous loop shape. However, the second recess 51 is not limited to the loop shape. The second recess 51 may be configured as described below. FIG. 4 is a diagram illustrating a base plate of a semiconductor device according to a second embodiment.

Referring to FIG. 4, a base plate 61 of the semiconductor device according to the second embodiment has a surface 62. Groove-shaped first recesses 63 are formed on the surface 62. The first recesses 63 are disposed facing an exposed area of a metal plate 13 located along the outer periphery of the metal plate 13. The plurality of first recess 63 are arranged spaced apart from each other in the peripheral direction along the outer periphery of the metal plate 13 in a plan view as viewed in the thickness direction of the base plate 61. In the example illustrated in FIG. 4, the four first recesses 63 are formed at positions corresponding to the four corners of the rectangular-shaped metal plate 13.

Further, groove-shaped second recesses are formed on the surface 62. Assuming that the inner side is defined as a side closer to the center than the outer periphery 26 of the metal plate 13, the groove-shaped second recesses are formed inward relative to the first recesses 63, while being spaced apart from the first recesses 63. In the plan view as viewed in the thickness direction of the base plate 61, the plurality of second recesses 64 are arranged spaced apart from each other in the peripheral direction along the outer periphery of the metal plate 13. In the example illustrated in FIG. 4, the four second recesses 64 are formed at positions corresponding to the positions of the first recesses 63. Accordingly, the second recesses 64 can be formed at appropriate positions. The second recesses 64 may be formed in parallel to the first recesses 63.

In the above-described embodiments, the depths of the second recesses 51 and 64 are equal to or less than the thicknesses of bonding materials 14. Further, the second recesses 51 and 64 are located away from semiconductor elements 18 in plan views in the thickness direction of the base plates 12 and 61. Further, the second recesses 51 and 64 are formed at positions closer to the outer peripheries of metal plates 13 than the semiconductor elements 18. However, the depths of the second recesses 51 and 64, the positions of the second recesses 51 and 64, and the like may be appropriately determined in accordance with the configurations of semiconductor devices 11.

Further, in the above-described embodiments, the second recess 51 has a shape whose width increases toward the upper end (opening) of the second recess 51 in the cross section illustrated in FIG. 3. However, the present invention is not limited thereto. The one side surface 52 and the other side surface 53 may extend parallel to the thickness direction of the base plate 12. Further, the inclination angle of the one side surface 52 may differ from the inclination angle of the other side surface 53. Further, edges where areas 20 adjacent to the second recess meet the respective side surfaces 52 and 53 may be rounded (that is, chamfered). Further, the side surfaces defining the second recess 51 may include curved surfaces. For example, in the cross section illustrated in FIG. 3, portions where the side surfaces 52 and 53 meet the bottom surface 54 may be rounded into arc shapes.

It should be understood that the embodiments disclosed herein are illustrative in all respects, and are not intended to be restrictive in any way. The scope of the present invention is not defined by the above-described embodiments, and is intended to include all modifications within the meaning and range equivalent to the scope of the claims.

DESCRIPTION OF REFERENCE NUMERALS 11 semiconductor device
12, 61 base plate
13 metal plate
14, 17 bonding material
15 insulating plate
16 circuit member
18, 19 semiconductor element
20 area
21 sealing material
22, 23 terminal
24 outer frame
25, 26, 27 outer periphery
28 area
31, 32, 33, 34, 35, 36, 37, 62 surface
38, 39 bonding wire
41, 63 first recess
42, 43, 52, 53 side surface
44, 54 bottom surface
45, 46 end
47 portion
51, 64 second recess

The invention claimed is:
1. A semiconductor device comprising:
a base plate;
a metal plate disposed above the base plate;
a bonding material disposed between the base plate and the metal plate and in surface contact with the base plate and the metal plate so as to bond the metal plate to the base plate;
an insulating plate disposed on the metal plate;
a circuit member disposed on the insulating plate and in surface contact with the insulating plate;
a semiconductor element mounted on the circuit member; and
a sealing material that covers the metal plate, the bonding material, the insulating plate, the circuit member, and the semiconductor element to seal a space on the base plate, wherein
the metal plate includes a bottom surface area that is located along an outer periphery of the metal plate and that is not covered by the bonding material,
the base plate includes a groove-shaped first recess that is formed along the outer periphery of the metal plate and that faces the bottom surface area, and also includes a groove-shaped second recess that is spaced apart from the first recess and that is formed on an inner side relative to the first recess, the inner side being defined as a side closer to a center than the outer periphery of the metal plate, and
the bonding material is disposed in at least a part of the second recess.

2. The semiconductor device according to claim 1, wherein an upper surface of the base plate and each side surface of the second recess are connected at an obtuse angle.

3. The semiconductor device according to claim 1, wherein a width of the second recess increases toward an upper end of the second recess.

4. The semiconductor device according to claim 1, wherein a depth of the second recess is less than or equal to a thickness of the bonding material.

5. The semiconductor device according to claim 1, wherein the second recess is located away from the semiconductor element in a plan view as viewed in a thickness direction of the base plate.

6. The semiconductor device according to claim 5, wherein the second recess is formed at a position closer to the outer periphery of the metal plate than the semiconductor element in the plan view as viewed in the thickness direction of the base plate.

7. The semiconductor device according to claim 1, wherein a shortest distance between the semiconductor element and the second recess in a plan view as viewed in a thickness direction of the base plate is larger than a distance between an upper surface of the circuit member and a upper surface of the base plate in the thickness direction of the base plate.

8. The semiconductor device according to claim 1, wherein the second recess is formed in a continuous loop shape in a plan view as viewed in a thickness direction of the base plate.

9. The semiconductor device according to claim 1, further comprising a plurality of second recesses arranged spaced apart from each other in a peripheral direction along the outer periphery of the metal plate.

10. The semiconductor device according to claim 1, wherein the first recess is formed in a continuous loop shape in a plan view as viewed in a thickness direction of the base plate.

11. A semiconductor device comprising:
a base plate;
a metal plate disposed above the base plate;
a bonding material disposed between the base plate and the metal plate and in surface contact with the base plate and the metal plate so as to bond the metal plate to the base plate;
an insulating plate disposed on the metal plate;
a circuit member disposed on the insulating plate and in surface contact with the insulating plate;
a semiconductor element mounted on the circuit member; and
a sealing material that covers the metal plate, the bonding material, the insulating plate, the circuit member, and the semiconductor element to seal a space on the base plate, wherein
the metal plate includes a bottom surface area that is located along an outer periphery of the metal plate and that is not covered by the bonding material,
the base plate includes a groove-shaped first recess that is formed along the outer periphery of the metal plate and that faces the bottom surface area, and also includes a groove-shaped second recess that is spaced apart from the first recess and that is formed on an inner side relative to the first recess, the inner side being defined as a side closer to a center than the outer periphery of the metal plate,
the bonding material is disposed in at least a part of the second recess,
an upper surface of the base plate and each side surface of the second recess are connected at an obtuse angle,
a width of the second recess increases toward an upper end of the second recess,
a depth of the second recess is less than or equal to a thickness of the bonding material,
the second recess is located away from the semiconductor element in a plan view as viewed in a thickness direction of the base plate,
the second recess is formed at a position closer to the outer periphery of the metal plate than the semiconductor element in the plan view as viewed in the thickness direction of the base plate,
a shortest distance between the semiconductor element and the second recess in the plan view as viewed in the thickness direction of the base plate is larger than a distance between an upper surface of the circuit member and the upper surface of the base plate in the thickness direction of the base plate, and
the first recess is formed in a continuous loop shape in the plan view as viewed in the thickness direction of the base plate.

12. The semiconductor device according to claim 11, wherein the second recess is formed in a continuous loop shape in the plan view as viewed in the thickness direction of the base plate.

13. The semiconductor device according to claim 11, further comprising a plurality of second recesses arranged spaced apart from each other in a peripheral direction along the outer periphery of the metal plate.

* * * * *